US005537668A

United States Patent [19]

Nambu et al.

[11] Patent Number: 5,537,668

[45] Date of Patent: Jul. 16, 1996

[54] AUDIO SIGNAL REPRODUCING DEVICE

[75] Inventors: Takafumi Nambu, Saitama; Tsuyoshi Sasaki, Tokyo; Akira Ogihara, Kanagawa, all of Japan

[73] Assignee: Sony Corporation, Tokyo, Japan

[21] Appl. No.: 330,225

[22] Filed: Oct. 27, 1994

Related U.S. Application Data

[63] Continuation of Ser. No. 932,102, Aug. 19, 1992, abandoned.

[30] Foreign Application Priority Data

Aug. 20, 1991 [JP] Japan .................................... 3-232403

[51] Int. Cl.[6] ........................................ H03G 9/00

[52] U.S. Cl. .......................... 381/102; 381/103; 381/108

[58] Field of Search .............................. 381/25, 74, 98, 381/103, 102, 101, 107, 108

[56] References Cited

U.S. PATENT DOCUMENTS 3,571,529 3/1971 Gharib .................................. 381/68.2

5,050,214 9/1991 Lee ........................................... 381/25

FOREIGN PATENT DOCUMENTS

| | | | |
|---|---|---|---|
| 0036230 | 3/1981 | European Pat. Off. . | |
| 0410157 | 5/1984 | European Pat. Off. . | |
| 0459506 | 5/1991 | European Pat. Off. . | |
| 3027953 | 7/1980 | Germany . | |
| 59-108497 | 6/1984 | Japan | 381/55 |
| 3-247098 | 11/1991 | Japan . | |
| 3-297209 | 12/1991 | Japan | 381/98 |

OTHER PUBLICATIONS

Zenith, "The Heritage," advertising brochure, circa 1969.

*Primary Examiner*—Forester W. Isen
*Attorney, Agent, or Firm*—Lise A. Rode; Robert P. Biddle; Jerry A. Miller

[57] ABSTRACT

In a reproducing device, e.g., in the portable tape player, the sound leakage from earphones is effectively avoided by directly detecting the signal level of medium to high frequency sounds at the earphone, and suppressing the signal level depending on the detected result thereof, so that the deterioration in sound quality is prevented and the sound leakage is effectively reduced.

16 Claims, 3 Drawing Sheets

AUDIO SIGNAL REPRODUCING DEVICE

This is a continuation of application Ser. No. 07/932,102 filed on Aug. 19, 1992, now abandoned, which is hereby incorporated by reference.

BACKGROUND OF THE INVENTION

1. Field of the Invention

This invention relates to an audio signal reproducing device. It is more particularly suitable for an application to audio devices such as a portable type tape players.

2. Background

Many people enjoy using portable type tape players privately by using earphones. In this type of tape player, as shown in FIG. 1, sound leakage from the earphone is considered undesirable. The higher the volume, the greater this undesirable sound leakage. Such sound leakage can be prevented by suppressing high frequency sounds.

However, as shown in FIG. 1, when only the high frequency sounds are suppressed, there is a deterioration in sound quality. Accordingly, the music is less enjoyable.

One of the methods used to reduce the sound leakage problem, as shown in FIG. 2, is to detect the level of sound (shown as characteristics K1 and K2) and to suppress the portion of the spectrum where the level of sound is high (as shown characteristics K11 and K12).

However, with this method the sound leakage is still not completely prevented. If the level of sound is increased in the tape player proper, sound leakage still occurs.

SUMMARY OF THE INVENTION

In view of the foregoing, an object of this invention is to provide a reproducing device capable of reducing the decline in sound quality while effectively avoiding the sound leakage from earphones.

The foregoing object and other objects of the invention have been achieved by the provision of an audio signal reproducing device which comprises amplifiers for amplifying the reproducing signals to be obtained from the prescribed recording medium; earphones for reproducing the output signals of amplifiers; signal level detection circuits for detecting signal level of medium to high frequency sounds regarding input signals of earphones; and gain control circuits for controlling gains of amplifiers; and suppresses entire frequency range of signal level of the input signal when the sound volume of medium to high frequency sounds of the input signal is high.

Regarding the input signals of the earphones the signal level of medium to high frequency signals is detected and when the sound volume of medium to high frequency sounds is high, the deterioration in sound quality can be effectively avoided and also sound leakage from earphones can be prevented by suppressing the signal level.

The nature, principle and utility of the invention will become more apparent from the following detailed description when read in conjunction with the accompanying drawings in which like parts are designated by like reference numerals or characters.

DETAILED DESCRIPTION OF THE INVENTION

Preferred embodiments of this invention will be described with reference to the accompanying drawings.

Figure 3:
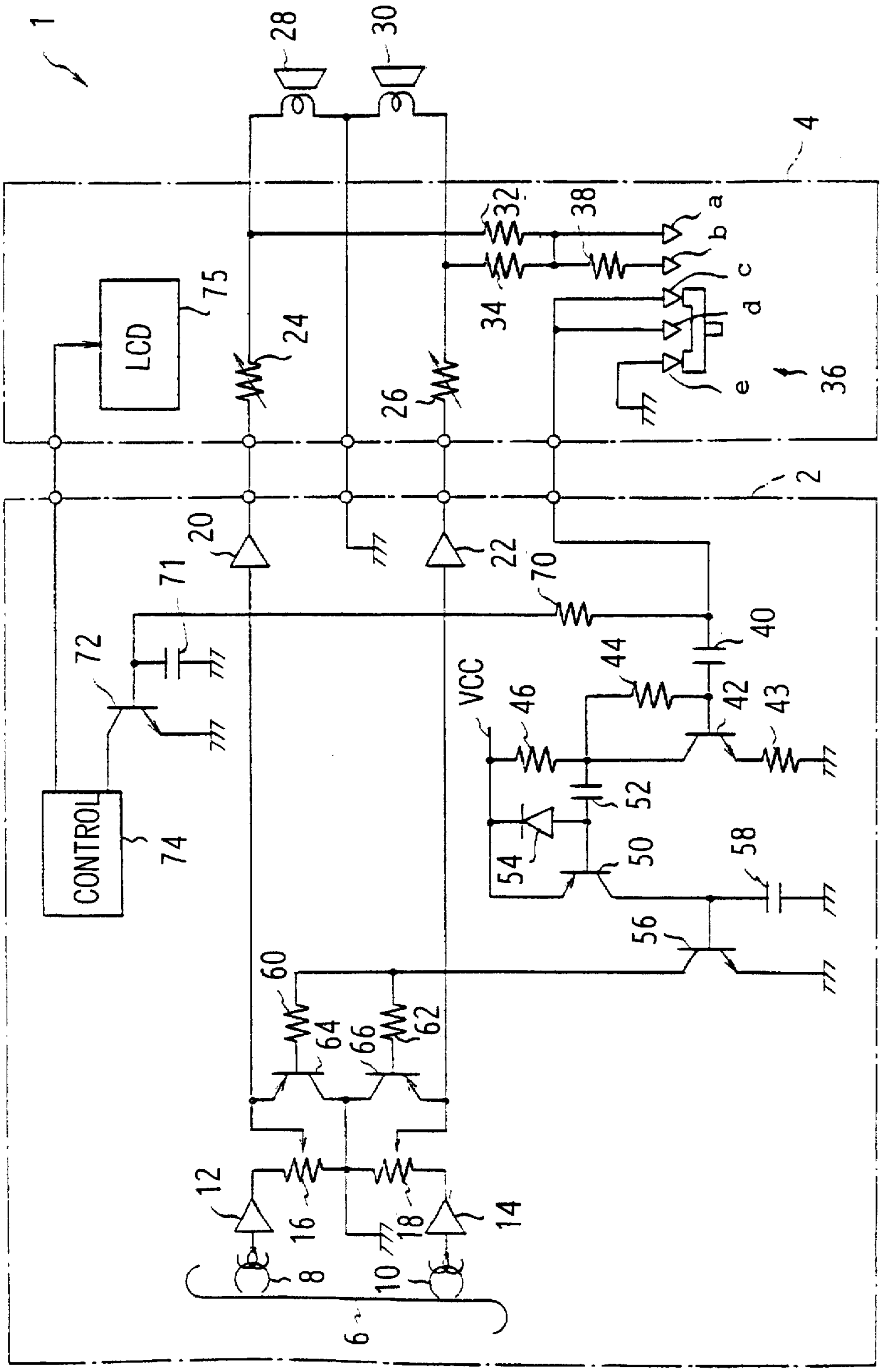
FIG. 3 is a block diagram illustrating a tape player according to one embodiment of the present invention.

Designated generally as 1, in FIG. 3 is a tape player. The function of the tape player 1 is changed by operating a controller 4 which is connected to the tape player body 2. In the tape player body 2, a magnetic tape 6 runs with the prescribed speed and the audio signal recorded on the magnetic tape 6 will be reproduced. In the tape player body 2, signals obtained from the magnetic heads 8 and 10 are amplified at the head amplifiers 12 and 14. Volume controls 16 and 18 are variable resistances used to adjust the sound level of signals from the head amplifiers 12 and 14. These signals are then supplied to amplifiers 20 and 22 where a predetermined level of gain is provided as prescribed by the controller 4.

In the controller 4, the output signals of amplifiers 20 and 22 are supplied to stereo type earphones 28 and 30 via sub sound level adjusting volume controls 24 and 26.

Thus, in the tape player 1, music can be enjoyed at a desired listening level of sound by adjusting the sound level adjusting volume controls 16 and 18. The sound level can be easily adjustable by operating the sub sound level adjusting volume controls 24 and 26 of the controller 4 as occasion demands.

In the controller 4, the input signals of the earphones 28 and 30 are added via the resistances 32 and 34, and supplied to the connecting point a of the slide switch 36. The slide switch 36 is adapted to change the connecting point in three steps by sliding the switch. The switch also connects the connecting point a and b with the resistance 38, and to connects the connecting point c and d, and to the ground connecting point e.

Thus, the slide switch 36 maintains the signal level of the output signal at the zero level by supplying the output signal of the connecting point c to the tape player body 2, on the condition that the connecting points c and e are short circuited. On the other hand, it feeds back the input signals of the earphones 28 and 30 via the resistances 32, 34 and 38, when the connecting points b and d are short circuited.

Furthermore, the slide switch 36 feeds back the input signals of the earphones 28 and 30 to the tape player body 2 via the resistances 32 and 34 on the condition that the connecting points a and c are short circuited.

With this arrangement, in the tape player 1, the signal level of the input signals of the earphones 28 and 30 are detected directly. Then the detected level can be changed by operating the slide switch 36.

In the tape player body 2, the output signal of the slide switch 36 is supplied to transistor 42 via capacitor 40. Capacitor 40 is selected to suppress passage of signals in the low-frequency range (e.g., below 1 Khz).

The emitter of transistor 42 is grounded through the emitter resistance 43. Resistor 44 is connected between the collector and the base. Bias voltage VCC is supplied via collector resistance 46.

The transistor 50 receives the collector output of the transistor 42 through capacitor 52. Capacitor 52 also suppresses signals in the low-frequency range. The collector output of transistor 50 is rectified at the diode 54 connected between the base and the emitter.

Accordingly, in the transistor 50, the signal level of signals in the medium to high frequency range (greater than about 1 Khz) at the input of the earphones 28 and 30 is detected.

The transistor 56 receives the collector output of the transistor 50 at the junction of its base and capacitor 58. The emitter of transistor 56 is grounded. The collector of transistor 56 is connected to the transistors 64 and 66 via the resistances 60 and 62.

Transistors 64 and 66 are connected to the sound level adjusting volume controls 16 and 18. Thus the signal level can be varied corresponding to the changes of base voltage of transistor 56 since the collector output controls to the output signals of the sound level adjusting volume controls 16 and 18.

Accordingly, in the tape player 1, when the connecting points c and e are selected using the slide switch 36, the earphones 28 and 30 will be driven by the signal level determined at the sound level adjusting volume controls 16 and 18 and sub sound level adjusting volume controls 24 and 26.

On the other hand, when the connecting points b and d are selected in the slide switch 36, a portion of the input signals of the earphones 28 and 30 are fed back as determined by the resistances 34 and 38. The transistors 64 and 66 are controlled depending on the level of feedback. Thus, the sound level of the earphones 28 and 30 is suppressed depending on the sound level of medium to high frequency portions of the signal. Here, the earphone output is controlled to not exceed 95 [dB] in signal level by selection of appropriate resistance values in 4.

Furthermore, when the connecting points a and c are selected in the slide switch 36, the input signals of the earphones 28 and 30 are fed back at a level of feedback determined by the resistances 32 and 34. Accordingly, the sound level of the earphones 28 and 30 are suppressed to an even greater degree compared with the case of selecting the connecting points b and d. Here, the earphone output is controlled to not exceed 85 [dB] in signal level by selection of the appropriate resistances in 4.

With this arrangement, in the tape player 1, the sound leakage from the earphones 28 and 30 can be effectively reduced by selecting the connecting point of the slide switch 36.

At this time, a signal level is detected directly at the input signal for earphones 28 and 30 in this embodiment. The volume suppression operation can be maintained even though volume controls 16 and 18 of the body 2 were operated. Therefore, the sound leakage can be effectively avoided.

The present invention also has the advantage of reducing the occurrence of hearing disorders as well as preventing the sound leakage.

Furthermore, the level of sound can be decreased without harming the frequency characteristic of reproduced signal by controlling the transistors 64 and 66,. Thus, the deterioration in sound quality of the tape player 1 can be effectively reduced.

Moreover, regarding the input signals of the earphones 28 and 30, even in case of reproducing with emphasis on low sounds, the level of sounds can be decreased only when necessary by detecting the signal level of medium to high frequency sounds and suppressing the level of sounds. And accordingly, the usability of the tape player 1 can be remarkably improved.

Figure 4:
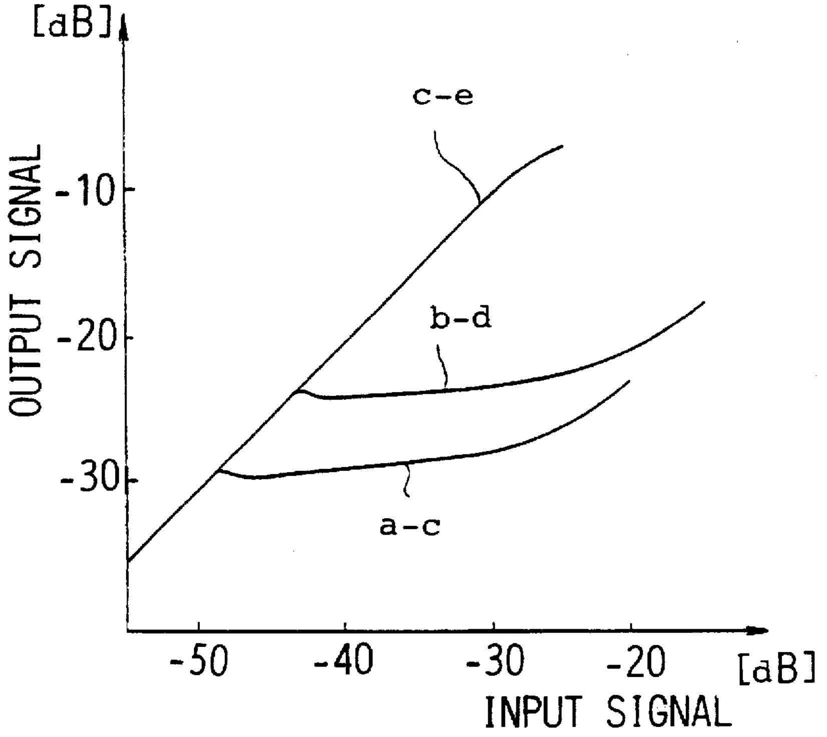
FIG. 4 is a characteristic curvilinear diagram showing its input/output characteristic.
Figure 5:
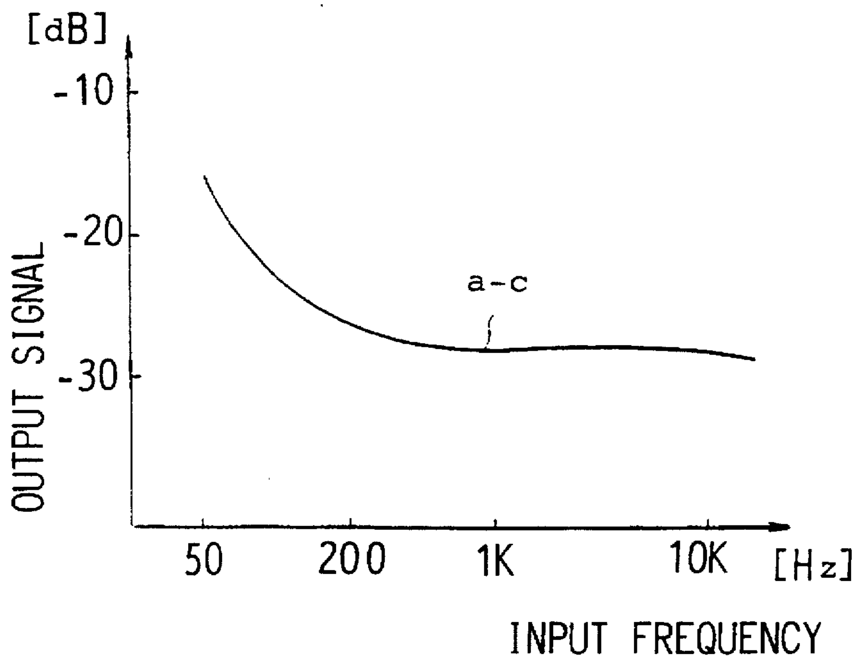
FIG. 5 is a characteristic curvilinear diagram showing its frequency characteristic.

As shown in FIGS. 4 and 5, according to an experiment, it was confirmed that in case of suppressing the level of sound by operating the slide switch 36, the deterioration in sound quality can be effectively avoided and thereby the level of sound can be suppressed.

Furthermore, according to the embodiment discussed above, since the slide switch 36 for the level of sound suppressing is installed in the controller 4, operation can be switched easily at hand whenever necessary, and accordingly, the usability of the tape player 1 can be improved.

Moreover, in the tape player body 2, the output signal of the slide switch 36 is transmitted to the transistor 72 via the resistance 70 and the capacitor 71, and thus the shifting information of the slide switch 36 will be supplied to the control circuit 74 via the transistor 72.

Figure 1:
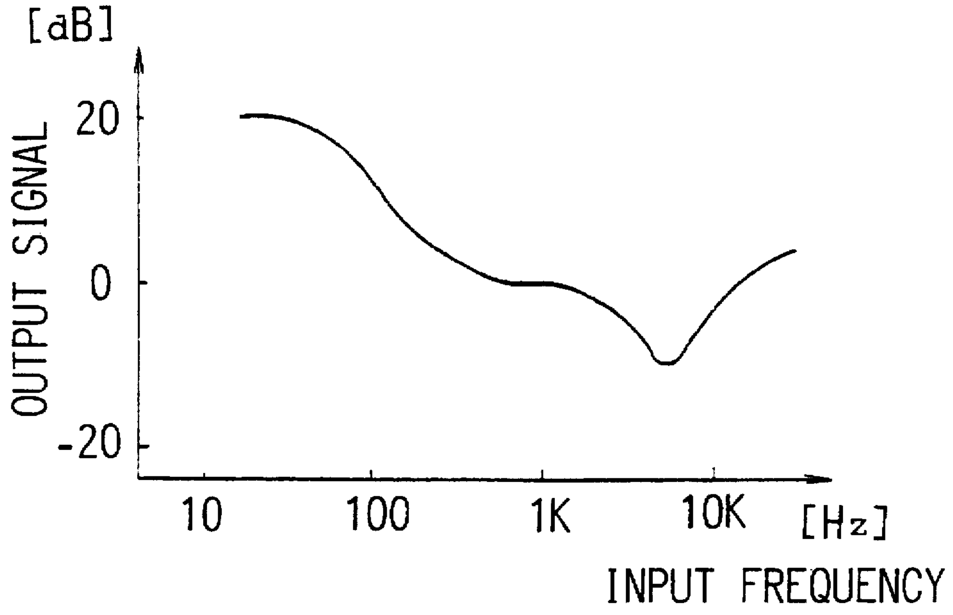
FIG. 1 (PRIOR ART)
FIG. 1 is a characteristic curvilinear diagram illustrating the prevention of sound leakage of the prior art.
Figure 2:
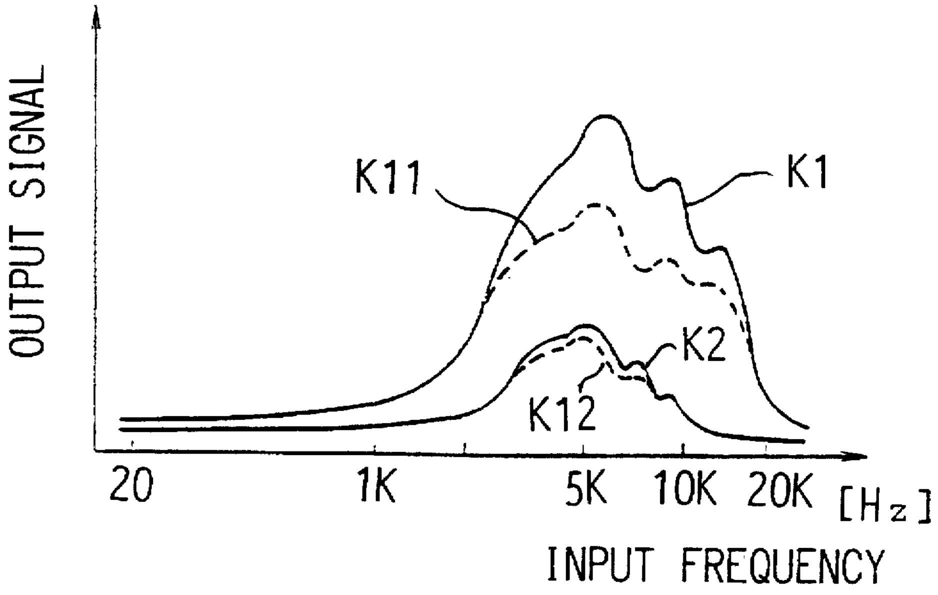
FIG. 2 (PRIOR ART)
FIG. 2 is a characteristic curvilinear diagram illustrating the other mechanism for preventing sound leakage of the prior art.

The control circuit 74 controls the overall function of the tape player 1 corresponding to the operation of controls, such as, conventional tape player operation switches (not shown in FIG. 1). Control circuit 74 drives a liquid crystal display unit 75 which is installed in the controller 4, to display information such as the position of switch 36. Thus, in the tape player 1, the status of the sound volume suppressing function can be confirmed by eye by viewing the display unit 75 of the controller 4, and the usability of the tape player 1 is improved.

According to the foregoing construction, the reproducing signals obtained from the magnetic heads 8 and 10 are adjusted to the prescribed level of sound at the sound level adjusting volume controls 16 and 18 via the amplifiers 12 and 14 and then supplied to the earphones 28 and 30 via the amplifiers 20 and 22 and sub sound level adjusting volume controls 24 and 26.

At this point, the input signals of the earphones 28 and 30 are supplied to the transistor 42 via the resistances 32 and 34 and the slide switch 36, and after the low frequency range band is suppressed herein, rectified at the diode 54, then the signal level of medium to high frequency sounds is detected via the transistor 50.

The detected result of said signal level is supplied to the transistors 64 and 66 via the transistor 56 and thus the sound level of reproduced signal will be suppressed.

According to the foregoing construction, regarding the input signals of the earphones 28 and 30, the signal level of medium to high frequency sounds is detected directly and by suppressing the signal level of the input signals depending on the detected result thereof, the level of sound can be suppressed effectively avoiding the deterioration in sound quality.

The embodiment discussed above has dealt with the case of applying the present invention to the tape player equipped with the controller. However, the present invention is not only limited to the above, but also suitably applied to the tape player which is adapted that the volume of sound can be adjusted only by the side of the tape player body.

Furthermore, the embodiment discussed above has dealt with the case of only suppressing the signal level. However, the present invention is not only limited to the above, but also frequency characteristic may be corrected at the same time.

Moreover, the embodiment discussed above has dealt with the case of applying the present invention to the tape players. However, the present invention is not only limited to the tape players, but also widely applicable to the sound reproducing devices which are adapted to test hearing by the earphone.

According to the foregoing invention, regarding the input signals of the earphones, the reproducing device which is capable of preventing the sound leakage by effectively avoiding the deterioration in sound quality, can be obtained after directly detecting the signal level of medium to high frequency sounds and by suppressing the signal level depending on the detected result.

While there has been described in connection with the preferred embodiments of the invention, it will be obvious to those skilled in the art that various changes and modification may be made therein without departing from the invention, and it is aimed, therefore, to cover in the appended claims all such changes and modifications as fall within the true spirit and scope of the invention.

What is claimed is:

1. An audio signal reproducing device for reducing sound leakage from earphones connected thereto, said audio signal reproducing device comprising:

an amplifier for amplifying input signals obtained from a recording medium and for producing an amplified audio output signal for driving an earphone without further amplification;

volume control means connected between an output of said amplifier and an input of said earphone;

a signal level detection circuit for detecting middle to high frequency audio signals at a junction between said volume control means and said earphone;

a signal level suppressing circuit for suppressing the signal level at said earphone depending on the detected result of said signal level detection circuit, wherein said signal level suppressing circuit suppresses the signal level at said earphone when said input signal is of middle to high frequency and exceeds a predetermined level.

2. The audio signal reproducing device according to claim 1, wherein said recording medium is a portable-type tape player.

3. The audio signal reproducing device according to claim 1, wherein said signal level suppression circuit includes a switch having a plurality of contacts through which suppressing signals are fed back to said signal level detection circuit so as to suppress said output signal level corresponding to the switching positions of said switch.

4. The audio signal reproducing device according to claim 3, wherein said switch is a slide switch.

5. The audio signal reproducing device according to claim 4, wherein said slide switch has a first contact for not suppressing said output signal level and a second contact for suppressing said output signal level to a first predetermined suppressed level.

6. An audio device, comprising:

an amplifier for receiving an input signal and producing an amplified output signal for driving an earphone without further amplification;

volume control means for coupling said output signal to said earphone;

monitoring means for monitoring a level of middle to high frequency components of said audio output signal at a junction between said volume control means and said earphone; and, suppressing means for suppressing said output signal level when said monitoring means determines that said level of said middle to high frequency components of said audio output signal exceeds a predetermined level.

7. The device of claim 6, further comprising switching means for selectively providing said audio output signal to said monitoring means.

8. The device of claim 7, wherein said switching means includes means for providing a selective proportion of said output signal to said monitoring means.

9. The device of claim 6, wherein said suppressing means prevents output greater than 95 dB in signal level.

10. The device of claim 6, wherein said suppressing means prevents output greater than 85 dB in signal level.

11. The device of claim 7, wherein said switching means includes a slide switch.

12. The device of claim 6, wherein said middle to high frequency content includes frequency content greater than 1 KHz.

13. The device of claim 6, further comprising means for extracting said input signal from a magnetic tape.

14. The device of claim 6, further comprising:

rectifying means for converting a portion of said output signal to a control signal; and wherein said suppressing means includes:

attenuating means, responsive to said control signal, for producing a level of attenuation proportional to said control signal.

15. An audio device, comprising:

means for extracting an input signal from a magnetic tape;

an amplifier for receiving said input signal and producing an amplified audio output signal for driving an earphone without further amplification;

volume control means for coupling said output signal to said earphone;

monitoring means for monitoring a level of audio output signal at a junction between said volume control means and said earphone;

suppressing means for suppressing said input signal when said monitoring means determines that said level of said middle to high frequency content of said audio output signal exceeds a predetermined level;

rectifying means for converting a portion of said output signal to a control signal;

switching means including a slide switch having three switch positions for selectively providing said audio output signal to said monitoring means, said switching means including means for providing a selective proportion of said output signal to said monitoring means so that said suppressing means prevents output greater than approximately 95 dB in signal level in one switch position and prevents output greater than approximately 85 dB in signal level in a second switch position, and disables said suppressing means in a third switch position, and wherein said suppressing means includes attenuating means, responsive to said control signal, for producing a level of attenuation proportional to said control signal.

16. The audio signal reproducing device of claim 4, wherein said slide switch has a third contact for suppressing said output signal level to a second predetermined level.

* * * * *